(12) United States Patent
Fuergut et al.

(10) Patent No.: US 7,485,493 B2
(45) Date of Patent: Feb. 3, 2009

(54) SINGULATING SURFACE-MOUNTABLE SEMICONDUCTOR DEVICES AND FITTING EXTERNAL CONTACTS TO SAID DEVICES

(75) Inventors: Edward Fuergut, Dasing (DE); Horst Groeninger, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/692,943

(22) Filed: Mar. 29, 2007

(65) Prior Publication Data

US 2007/0232024 A1 Oct. 4, 2007

Related U.S. Application Data

(63) Continuation of application No. PCT/DE2005/001676, filed on Sep. 22, 2005.

(30) Foreign Application Priority Data

Sep. 30, 2004 (DE) ........................ 10 2004 048 202

(51) Int. Cl.
*H01L 21/00* (2006.01)

(52) U.S. Cl. ................ 438/112; 438/113; 438/121; 438/124; 438/462; 257/E23.006; 257/E21.51; 257/E21.511; 257/E21.521

(58) Field of Classification Search ............... 438/112, 438/113, 124, 462; 257/E21.51, E23.006, 257/E21.511, E21.521
See application file for complete search history.

(56) References Cited

U.S. PATENT DOCUMENTS

| | | | |
|---|---|---|---|
| 5,273,938 A * | 12/1993 | Lin et al. ................ 438/107 |
| 6,291,272 B1 * | 9/2001 | Giri et al. ................ 438/121 |
| 6,309,909 B1 * | 10/2001 | Ohgiyama ............... 438/112 |
| 6,451,627 B1 * | 9/2002 | Coffman ................. 438/111 |
| 6,566,627 B2 * | 5/2003 | Brandinger et al. .... 219/121.69 |
| 6,602,734 B1 | 8/2003 | Wada et al. | |
| 6,713,381 B2 * | 3/2004 | Barr et al. ............... 438/622 |
| 7,140,951 B2 * | 11/2006 | Kurosawa ................ 451/54 |
| 7,205,658 B2 * | 4/2007 | Lee et al. ................. 257/730 |
| 2001/0055856 A1 | 12/2001 | Tao | |
| 2002/0055238 A1 | 5/2002 | Sugino et al. | |
| 2003/0109072 A1 | 6/2003 | Meyer et al. | |
| 2003/0199122 A1 | 10/2003 | Wada et al. | |
| 2005/0178495 A1 | 8/2005 | Aspar et al. | |
| 2007/0128766 A1 * | 6/2007 | Yip ......................... 438/108 |
| 2007/0275506 A1 * | 11/2007 | Yamazaki et al. ........ 438/118 |

FOREIGN PATENT DOCUMENTS

JP 2003034780 A 7/2003

* cited by examiner

*Primary Examiner*—George Fourson
*Assistant Examiner*—Julio J. Maldonado
(74) *Attorney, Agent, or Firm*—Edell, Shapiro & Finnan, LLC

(57) ABSTRACT

Methods for singulating surface-mountable semiconductor devices and for fitting external contact areas to the devices are described herein. Semiconductor device components are applied to a metallic carrier in rows and columns in corresponding semiconductor device positions of the metallic carrier. Thereafter, a plurality of components, situated in the device positions, is embedded into a plastic housing composition, thereby producing a composite board. The composite board is subsequently separated into individual semiconductor devices by laser ablation, the semiconductor devices being inscribed on their top sides via the laser technique. The top sides with the inscription can then be adhesively bonded to an adhesive film, so that the undersides of the devices can be uncovered while maintaining the semiconductor device positions.

20 Claims, 3 Drawing Sheets

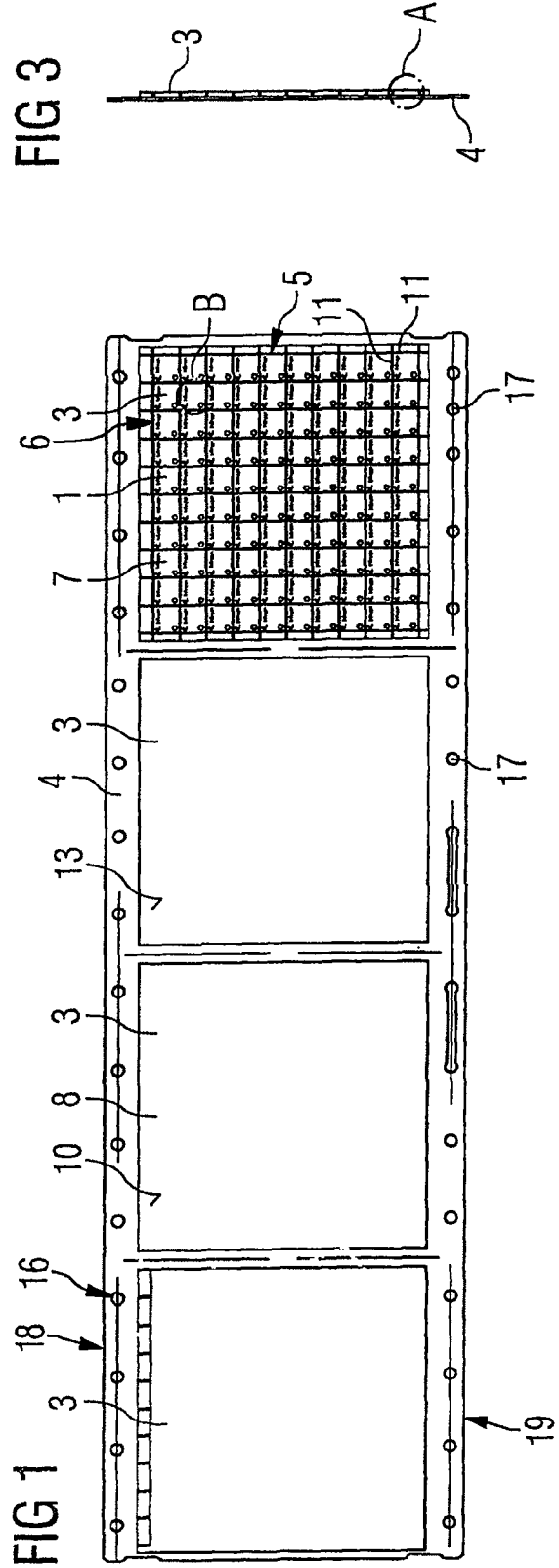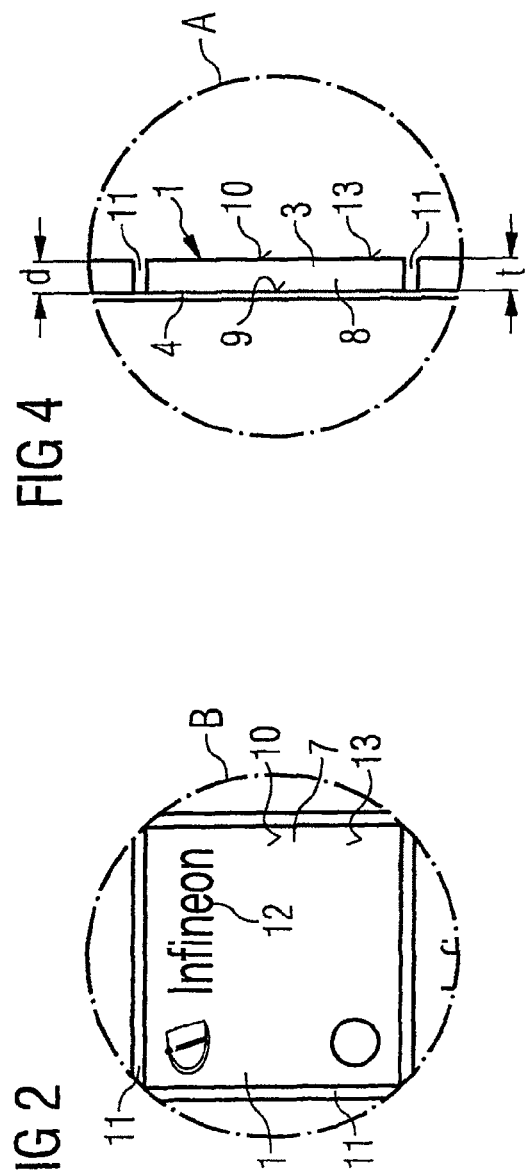

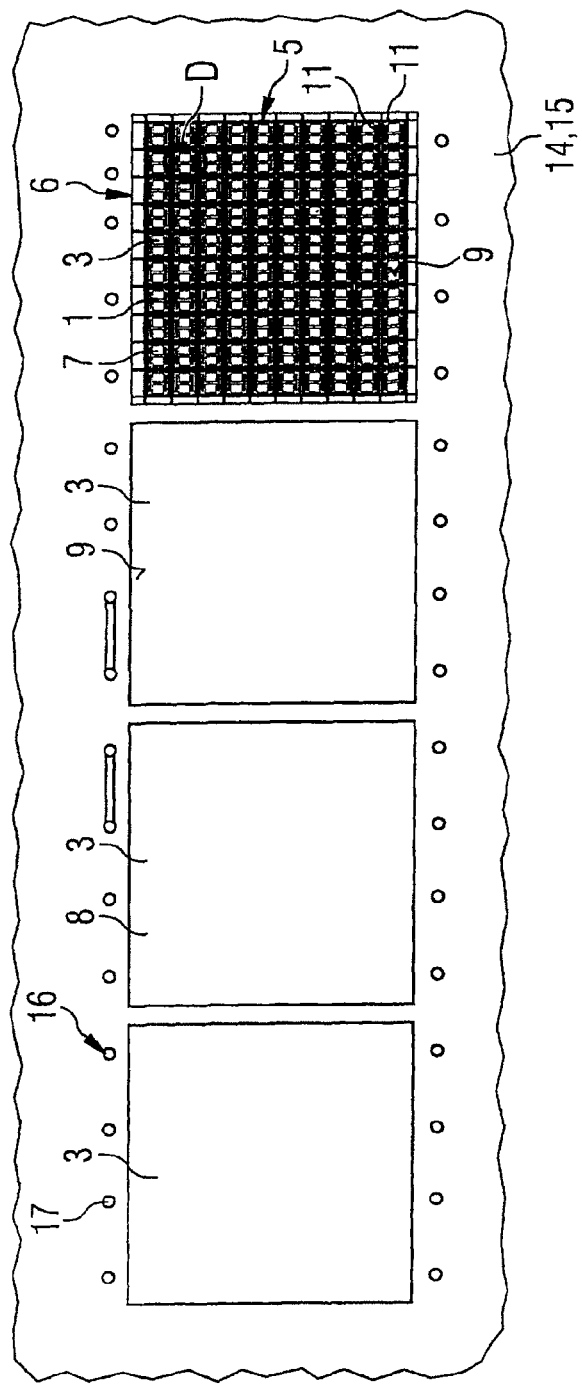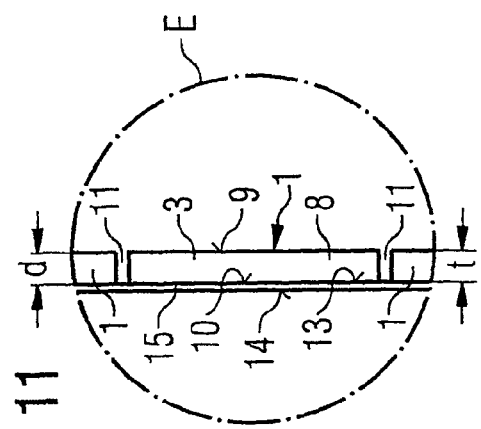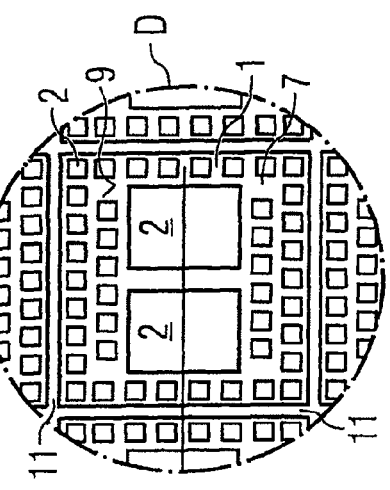

US 7,485,493 B2

SINGULATING SURFACE-MOUNTABLE SEMICONDUCTOR DEVICES AND FITTING EXTERNAL CONTACTS TO SAID DEVICES

CROSS REFERENCE TO RELATED APPLICATIONS

This application is a continuation of International Application No. PCT/DE2005/001676, filed on Sep. 22, 2005, entitled "Method for Singulating Surface-Mountable Semiconductor Devices and for Fitting External Contacts to Said Devices," which claims priority under 35 U.S.C. §119 to Application No. DE 102004048202.0 filed on Sep. 30, 2004, entitled "Method for Singulating Surface-Mountable Semiconductor Devices and for Fitting External Contacts to Said Devices," the entire contents of which are hereby incorporated by reference.

BACKGROUND

Conventional leadless housings, such as TSLP (thin small leadless package) housings, are typically singulated via a separation by grinding process. For this purpose, a metallic carrier on which a plurality of semiconductor devices and wiring structures are arranged on a common plate comprising a plastic housing composition is first etched away chemically, so that the wiring structures are uncovered and are freely accessible. As a result, corresponding metallic contact areas of the wiring structures can be coated to form external contact areas or can have external contacts fitted to them.

A plurality of the semiconductor devices are embedded into a common plastic composition under the common so-called "mold cap", which is called composite board hereinafter. The composite board unites the wide variety of components of the semiconductor devices, such as semiconductor chips, connecting elements, external contact areas, etc., in a plate-type plastic body which, after the external contact areas have been fitted thereto, is subsequently separated into individual surface-mountable semiconductor devices via a sawing technique. For this purpose, the composite board is adhesively bonded on to a sawing film and the semiconductor devices are subsequently singulated on the sawing film via a wafer saw. After singulation, the semiconductor devices are arranged on the sawing film in such a way that they can be tested with regard to their functionality via the external contact areas or the external contacts before they are removed from the sawing film and packaged into corresponding transport belts.

This method has the disadvantage that the known separating by grinding processes for singulating the semiconductor devices are complex in terms of process engineering on account of the high loading of the plastic housings and the wear of the saw blades during these manufacturing operations. One reason for the failure rate after the separating by grinding can be seen in the fact that not only is the metallic carrier ground away, but also the adjoining wiring structure can be detrimentally affected.

SUMMARY

Described herein are methods for singulating surface-mountable semiconductor devices and for fitting external contact areas to the devices. Semiconductor device components are applied to a metallic carrier in rows and columns in corresponding semiconductor device positions of the metallic carrier. Thereafter, a plurality of components, situated in the device positions, is embedded into a plastic housing composition, thereby producing a composite board. The composite board is subsequently separated into individual semiconductor devices by laser ablation, the semiconductor devices being inscribed on their top sides via the laser technique. The top sides with the inscription can then be adhesively bonded to an adhesive film, so that the undersides of the devices can be uncovered while maintaining the semiconductor device positions.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

FIG. 1 shows a schematic plan view of a metallic carrier with 4 applied composite boards, partly separated in device positions, with a plurality of semiconductor device positions;

FIG. 2 shows an enlarged schematic plan view of a detail B from FIG. 1;

FIG. 3 shows a schematic side view of the metallic carrier with applied composite boards;

FIG. 4 shows an enlarged schematic side view of a detail A from FIG. 3;

FIG. 8 shows a schematic plan view of the adhesive film from FIG. 5 and the underside of the separated composite boards;

FIG. 9 shows an enlarged schematic plan view of a detail D from FIG. 8;

FIG. 10 shows a schematic side view of the adhesive film with separated composite boards; and FIG. 11 shows an enlarged schematic side view of a detail from FIG. 10.

DETAILED DESCRIPTION

Figure 5:
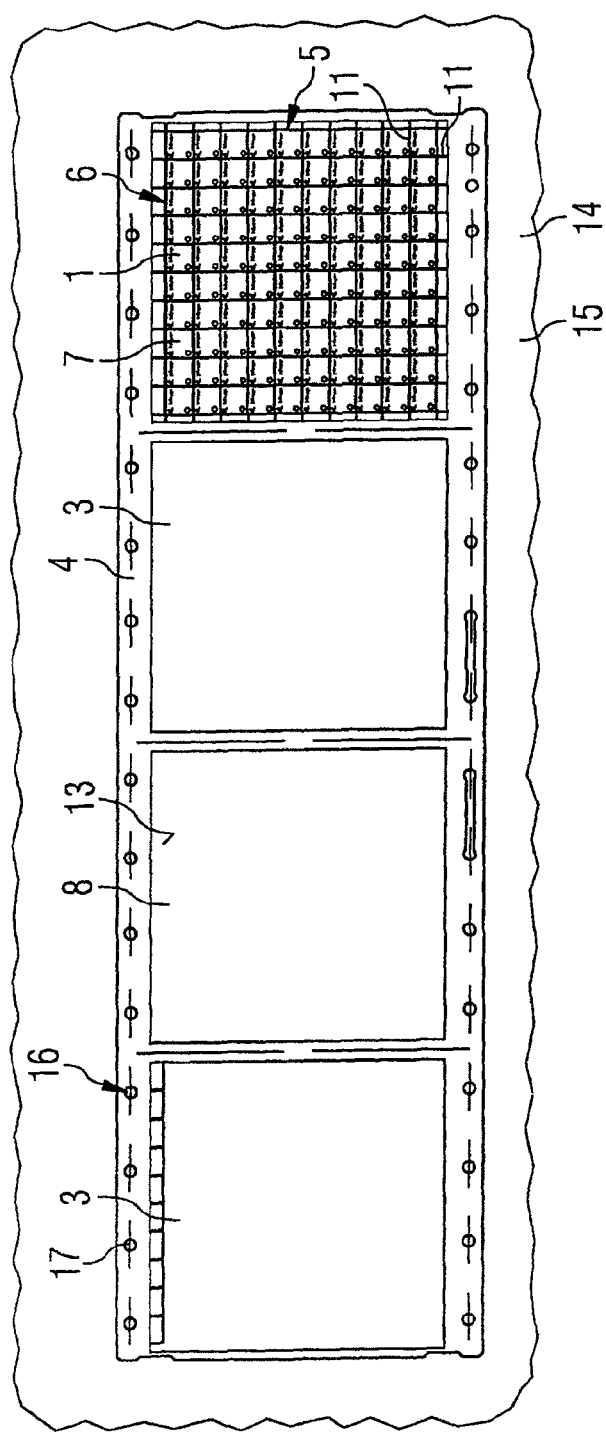
FIG. 5 shows a schematic plan view of an adhesive film applied to the top sides of the separated composite boards.

Methods are described herein in which the manufacturing of surface-mountable semiconductor devices is facilitated and the reject rate during manufacturing is reduced. Furthermore, the methods allow for inscribing the devices in the device positions of a composite board before the semiconductor devices are processed further.

An exemplary method for singulating surface-mountable semiconductor devices and for fitting external contact areas to the devices comprises the following method steps.

First, a composite board is produced on a perforated metallic carrier comprising semiconductor device positions arranged in rows and columns. The metallic carrier may also have a plurality of composite boards. For a composite board of this type, components of a plurality of semiconductor devices are embedded into a common plastic housing composition. The composite board includes a wiring structure with metal contacts disposed toward the metallic carrier on an underside of the composite board. The top side of the composite board is formed by a planar area of the common plastic housing composition of all the semiconductor devices of a composite board.

In a next step, separating trenches are introduced into the plastic housing composition of the composite board via laser ablation for the singulation of the semiconductor device positions. The separating trenches surround the semiconductor device positions. The depth of the separating trenches introduced by laser ablation is limited by the metallic carrier.

After introducing the separating trenches, a device inscription can be applied on the top sides of the plastic housings in the respective device positions via laser ablation. After the inscription of the plastic housings of the semiconductor devices, a common adhesive film is applied as holding strip to the top sides of the plastic housings. It is then possible, without the semiconductor devices of a composite board falling apart, for the metallic carrier to be removed while maintaining the semiconductor device positions on the adhesive film and while uncovering the metal contacts arranged on the underside of the composite board.

The uncovered metal contacts are then reinforced with surface-mountable contact external areas. This reinforcement can also take place via a corresponding coating simultaneously for the multiplicity of the metal contacts of the individual semiconductor devices without the need for an individual fitting of individual external contact areas in each of the metal area positions. Once external contact areas have been produced, therefore, it is possible to test the functionality of the semiconductor devices still on the adhesive film by making contact with the applied freely accessible external contact areas. Thereafter, the semiconductor devices are singulated while removing functional and inscribed semiconductor devices from the adhesive film.

This method for singulating semiconductor devices and for applying external contact areas for surface-mountable semiconductor devices has the advantage that method steps that are non-critical in terms of manufacturing technology can be carried out. Instead of the extremely critical sawing out of semiconductor devices on an adhesive film, with this method, while the semiconductor devices are still held together on the metallic carrier in the form of a composite plate, mild laser removal is introduced. The laser separating technique makes it possible to reduce the width of the separating tracks in the form of separating trenches in comparison with the sawing tracks dependent on the thickness of the saw blades.

Furthermore, this method has the advantage that the adhesive film can be utilized for joint application of a multiplicity of external contact areas to the undersides of the semiconductor devices. Finally, the introduction of the separating trenches via laser ablation can be combined with the inscription of the planar surfaces of the semiconductor devices in a suitable manner. A further advantage of this method is that the introduction of the separating trenches is relatively independent of curvatures of the composite board. Consequently, in contrast to the separating method via a sawing technique, it is not necessary to arrange the composite board on a correspondingly dimensionally stable sawing film which tolerates only extremely little warpage of the composite board or none whatsoever, in the course of providing the sawing joints.

In one embodiment, after the testing of the functionality of the semiconductor devices and after the singulation of the semiconductor devices, the latter are packaged from the adhesive film into a transport belt. Inscription of the individual devices is obviated since this, too, has already taken place for many devices simultaneously on the top side of the composite board or on a metallic carrier. Both the visual inspection and the metrological checking of the semiconductor devices show that the reject rate was able to be lower as a result of the described method and it is therefore possible to ship a larger number of functional semiconductor devices per batch.

The wiring structure with metal contacts on the underside of the composite board is first produced by selective electrodeposition of metal structures on the metallic carrier in one embodiment. For this purpose, the carrier is preferably formed from a copper alloy, in which case, in the respective semiconductor device positions provided, not only is it possible to deposit metal contact areas but it is possible to produce connecting lines which enable an electrical connection between metal contact areas and contact areas of the semiconductor chips via bonding wires of flip-chip contacts.

Optionally, a semiconductor chip is applied to the wiring structure in the semiconductor device positions and the semiconductor chip is electrically connected to the wiring structure via connecting elements prior to the application of a plastic housing composition. The wiring structure on the metallic carrier, the semiconductor chip and the connecting elements to the wiring structure form components of a semiconductor device of a semiconductor device position.

The semiconductor chip can be applied to the wiring structure via an adhesive bonding technique. If an electrical contact to the wiring structure is to be produced, the adhesive bonding technique can also be carried out via a conductive adhesive. Other options for electrically connecting the semiconductor chip to the wiring structure are formed via soldering techniques, wherein both eutectic soldering techniques and diffusion soldering techniques and also soft solder techniques, in particular with lead-free solders, are available for the application of the semiconductor chips to the wiring structure.

Bonding wires or flip-chip contacts are used as connecting elements between corresponding contact areas of the semiconductor chip and the wiring structure. For fitting bonding wires, a rear side of the semiconductor chip is fixed on the wiring structure and corresponding contact pads of the wiring structure are subsequently connected to corresponding contact areas on the active top side of the semiconductor chip via bonding wires.

In the case of semiconductor chips with flip-chip contacts, the latter are soldered on to corresponding contact pads that are adapted in terms of size, structure and arrangement to the size and arrangement of the flip-chip contacts of the semiconductor chip.

After the components such as the metallic contact areas of the wiring structure, the wiring structure, the semiconductor chip and the corresponding connections to the wiring structure have been produced, a common plastic housing composition is applied to a plurality of semiconductor devices in order to produce a composite board on the metallic carrier. In this case, a plurality of composite boards can be positioned one behind another on a metallic carrier of this type, the plastic housing composition then being applied via a dispensing method in one exemplary implementation of the method. During the dispensing method, the components in the semiconductor device positions are embedded into the plastic housing composition.

A further possibility of embedding the components is with the aid of injection-molding methods in which the plastic composition of a composite board is pressed into corresponding injection molds at high pressure, the high pressure ensuring that all the interspaces between the components are completely filled by plastic composition.

After the release of the metallic carrier with its applied composite boards from the injection mold it is then possible to carry out the introduction of the separating trenches in each of the composite boards or the plastic compositions of the composite boards. After introducing the separating trenches surrounding the semiconductor devices, the laser energy of the laser apparatus for an inscription of the top side of the plastic composition is to be reduced in comparison with the laser energy for the introduction of the separating trenches, so that, with reduced laser energy, the inscription is then applied to the multiplicity of resultant semiconductor devices that are still fixed on the metallic carrier.

The inscription of the surfaces is followed by the application of an adhesive film, the adhesive film being provided with a perforation before it is adhesively bonded as holding strip onto the plastic housing composition of the semiconductor device positions. With the aid of the perforation of the adhesive film, each of the semiconductor devices can remain in the semiconductor device positions and nevertheless be processed further together with the other semiconductor devices. For this purpose, the metallic carrier is removed while maintaining the semiconductor device positions on the adhesive film via wet etching. Besides wet etching, the carrier may also be removed via plasma etching, which is known as a dry etching method, or else be removed via laser ablation.

When the carrier is removed, at least the metal contacts on the underside of the semiconductor devices are then uncovered. The metal contacts can be electrically connected to the semiconductor chip via the wiring structure with the embedded connecting elements. The metal contacts are then reinforced to form surface-mountable external contact areas, optionally via a solder technique. Other reinforcement possibilities consist in applying the surface-mountable external contact areas via electrochemical deposition, or effecting the reinforcement of the metal contacts to form surface-mountable external contact areas via electroless deposition of metals.

In addition to the external contact areas, solder balls can also be soldered on to the functional semiconductor devices prior to removal from the adhesive film. The solder balls as external contacts have the advantage that, depending on construction and structuring, they can form a limited compensation between coefficients of thermal expansion and a limited attenuation of thermal stress between a surface-mountable semiconductor device and a superordinate circuit board.

To summarize, it can be stated that the entire metallic carrier with a plurality of composite boards can be structured to form semiconductor devices with the aid of the laser. For this purpose the "mold compound" or the common plastic housing composition is removed down to the metallic carrier in corresponding separating trenches without damaging the metallic carrier, which may be a copper alloy. Such a so-called "precut laser" can inscribe the individual devices after structuring with reduced power. It is subsequently possible for the semiconductor devices which are separated in the semiconductor device positions but are still held together via the metallic carrier to be separated from one another via the electroplating by etching away the carrier, with the result that semiconductor devices are held together only by the adhesive film.

The contact areas of the individual semiconductor devices can then be chemically-mechanically coated in order to produce external contact areas for the surface-mountable semiconductor devices. The adhesive film with the adhering semiconductor devices and their external contact areas can then enable the functionality testing of the semiconductor devices in the test bed. The functional devices are then transferred directly from the adhesive film into a corresponding transport belt.

Consequently, the method according to the invention has the following advantages: elimination of the separating by grinding process; reduction of the sawing track width to a minimum; use of adhesive films which are thinner and thereby more favorable than in the sawing separating process; handling of individual composite boards is not necessary since the smallest unit during singulation, during lamination of the adhesive film and during electroplating is the size of the original carrier; a separate cleaning step such as the so-called "spin cleaning", as is required after sawing, can be omitted; a flexure of composite boards on account of the plastic housing composition, owing to the fact that low-viscosity molding compositions are used as plastic housing composition, is non-critical in this method since a load-relieving step, the so-called "precut", can be carried out directly after the so-called "molding" or injection molding; and a singulation of non-rectangular semiconductor devices is possible.

Exemplary embodiments of the methods of the invention are now described with reference to the figures.

FIG. 1 shows a schematic plan view of a metallic carrier 4 with four applied composite boards 3—partly separated in semiconductor device positions 7—with a plurality of semiconductor device positions 7. The carrier 4 comprises perforations 16 at its edge sides 18 and 19 that are not covered by composite boards 3, the perforation holes 17 of the perforations being arranged in such a way that automatic transport and accurately fitting insertion into corresponding holding mechanisms of manufacturing equipment are possible. The metallic carrier 4 is also referred to as a leadframe for historical reasons, even though the metallic carrier 4 has no leads.

Rather, on the metallic carrier 4, under so-called "mold caps" in the semiconductor device positions 7, components of semiconductor devices 1 are embedded into a plastic housing composition 8 with the composite boards 3. These embedded semiconductor device components include a semiconductor chip and connecting elements for connecting the semiconductor chip to a wiring structure and to metal contacts. The metal contacts are galvanically applied to the metallic carrier and are not visible from the plan view shown in FIG. 1 of four composite boards 3 of a metallic carrier 4.

In this illustration, the composite board 3 on the far right has already been divided by introducing separating trenches 11 in semiconductor device positions 7 with semiconductor devices 1 arranged in rows 5 and columns 6. The separating trenches 11 are introduced into the plastic housing composition 8 by laser ablation and divide the composite board 3 into individual semiconductor devices 1 which, however, are still fixed on the metallic carrier 4. Since the top side 10 of the composite boards 3 is freely accessible, it is possible to perform an inscription on the top side 13 of the plastic housing composition 8 in the semiconductor device positions 7 before or after the introduction of the separating trenches 11. A detail B is marked in respect of this in FIG. 1 and is illustrated in more detailed fashion in FIG. 2.

FIG. 2 shows an enlarged schematic plan view of a detail B from FIG. 1. The detail B reveals the separating trenches 11 surrounding a semiconductor device position 7, the separating trenches 11 being introduced by laser ablation and the same laser being used, but with lower radiation intensity, to apply the device inscription 12 shown in FIG. 2 to the top side 13 of the plastic housing composition 8.

FIG. 3 shows a schematic side view of the metallic carrier 4 with applied composite boards 3.

FIG. 4 shows an enlarged schematic side view of a detail A from FIG. 3. Three semiconductor devices 1 are illustrated in side view in the detail A, the semiconductor devices being separated by two separating trenches 11 in the plastic housing composition 8. The depth t of the separating trenches 11 is delimited by the metallic carrier 4, the laser removal in the separating trenches 11 being delimited during the laser ablation on account of the higher reflectivity of the metallic carrier 4. The metallic carrier 4 comprises a copper alloy in this embodiment. In this case, the thickness d of the semiconductor devices 1 corresponds to the thickness of the composite boards 3 applied on the carrier 4.

The illustration of the semiconductor components such as a wiring structure on the underside 9 of the composite board 3 and a semiconductor chip and its connecting elements has been dispensed with in this illustration since FIG. 4 merely shows an enlarged schematic side view of the detail A shown in FIG. 3. In principle, this technique of laser separation, the result of which is shown in FIG. 4, and laser inscription, the result of which is shown in FIG. 2, can be used for a wide variety of composite boards 3. Since the laser ablation can advantageously be tracked, warpages of the composite board 3 on the metallic carrier 4 is not a problem for this technique. Moreover, strains and warpages that could occur during the application of the plastic housing composition 8 can advantageously be compensated for by the separating trenches 11.

FIG. 5 shows a schematic plan view of an adhesive film 14 applied to the top side 13 of the plastic housing composition 8 of the separated composite boards 3. Both the composite boards 3 and the metallic carrier 4 are arranged below the adhesive film 14. The adhesive film 14 simultaneously serves as a holding strip 15 for the further processing of the separated semiconductor devices 1, the latter adhering to the adhesive film 14 by their inscribed top sides 13.

The perforation 16 and the perforation holes 17 are transferred to the holding film 15 in the form of the adhesive film 14, with the result that the alignment and orientation possibilities for the separated semiconductor device positions 7 on the adhesive film 14 are the same as those on the metallic carrier 4. Accordingly, it is also possible to arrange a plurality of metallic carriers 4 on an adhesive film 14 of this type. Since the semiconductor devices 1 are fixed in their positions by their top sides 13 via the adhesive film 14, the carrier 4 can then be removed.

Figure 6:
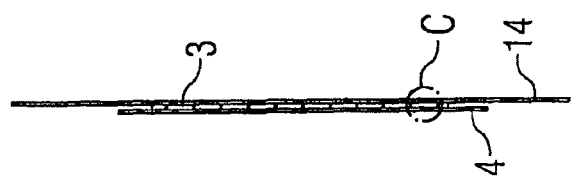
FIG. 6 shows a schematic side view of the composite boards of the adhesive film and the metallic carrier.

FIG. 6 shows a schematic side view of the composite boards 3 with adhesive film 14 and metallic carrier 4. FIG. 6 furthermore shows a detail C, which is illustrated on an enlarged scale in FIG. 7.

Figure 7:
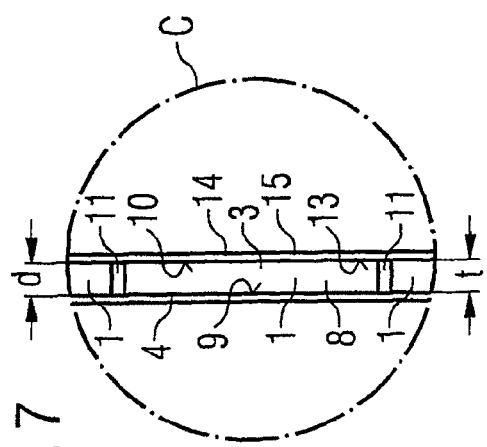
FIG. 7 shows an enlarged schematic side view of a detail from FIG. 6.

FIG. 7 shows an enlarged schematic side view of the detail C from FIG. 6. In this case the composite board 3 has already been separated into individual semiconductor devices 1 via the separating trenches 11, the inscription of the semiconductor devices 1 that is shown in FIG. 2 being arranged on the top side 13 and a wiring structure of the semiconductor device 1 being arranged on the underside 9 of the composite board 3. The wiring structure can be uncovered via etching away the metallic carrier 4 from the underside 9 of the composite board 3.

FIG. 8 shows a schematic plan view of the adhesive film 14 from FIG. 5 and the undersides 9 of the separated composite boards 3. The semiconductor devices 1 are still divided in rows 5 and columns 6 via the separating trenches 11 and are completely uncovered after the removal of the carrier 4 shown in FIG. 7. In this case, metal contacts are then accessible on the undersides 9 of the composite boards 3. The metal contacts can have external contact areas 2 fitted to them in further steps. However, this fitting does not take place individually, but rather in parallel and simultaneously for all the metal contacts that are accessible on the underside 9. For this purpose, the metal contact can be reinforced in an electroplating bath or via electroless deposition of the metal contact. It is also possible to reinforce the metal contact via soldering-on methods.

FIG. 9 shows an enlarged schematic plan view of a detail D from FIG. 8. In this case, too, the separating trenches 11 delimit a semiconductor device 1 with external contact areas 2 of different sizes being arranged on the underside 9 of the composite boards are shown. In the center of the semiconductor device 1, larger contact areas are arranged on the underside 9 than at the edges of the semiconductor device. This shows that semiconductor chips are arranged on the larger contact areas in the center which are part of a wiring structure, while the external contact areas 2 established in the edge regions serve as signal connections or power supply connections toward the semiconductor chip.

Since all the external contact areas 2 are arranged on the underside 9, this is a semiconductor device 1 which can be fitted in surface-mountable fashion on to a superordinate circuit board if the superordinate circuit board has corresponding contact areas having the same size and arrangement. On the other hand, it is also possible to apply external contacts in the form of solder balls to the external contact areas 2 and thus to provide a semiconductor device 1 which can be connected to superordinate circuit boards via solder balls.

FIG. 10 shows a schematic side view of the adhesive film 14 with separated connecting boards and a detail E of this side view.

FIG. 11 shows an enlarged schematic side view of the detail E from FIG. 10. The external contact areas 2 shown in FIG. 9 are arranged on the underside 9 of the semiconductor device 1. The separating trenches 11 reach as far as the plastic film 14, which simultaneously represents a holding film 15. The external contact areas 2 shown in FIG. 9 can be reinforced on the plastic film 14 by dipping into an electroplating bath. In this case, both solder alloys and other noble metal contact alloys can be applied in order, on the one hand, to reinforce the metal contact areas of the wiring structure and, on the other hand, to protect the metal areas as external contact areas against corrosion.

Since the external contact areas are then freely accessible, in this production phase each individual semiconductor device 1 can be tested with regard to its functionality, and semiconductor devices that do not meet the quality requirements can also be marked on the holding film 15, so that only the semiconductor devices 1 which are fully functional are removed from the adhesive film 14 or holding film 15 and packaged in a transport belt.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for singulating surface-mountable semiconductor devices and for fitting external contact areas to the devices, the method comprising:

producing a composite board on a metallic carrier including semiconductor device positions arranged in rows and columns by embedding components of a plurality of semiconductor devices into a common plastic housing composition, the device positions including a wiring structure with metal contacts oriented toward the carrier on an underside of the composite board and a planar area of the common plastic housing composition disposed on a top side of the composite board;

introducing separating trenches into the plastic housing composition that surround the semiconductor positions via laser ablation so as to facilitate singulation of the semiconductor device positions, wherein a depth of the separating trenches extends from the top side of the composite board to the metallic carrier;

applying an adhesive film as a holding strip to top sides of semiconductor device positions;

removing the metallic carrier while maintaining the semiconductor device positions on the adhesive film and while uncovering the metal contacts arranged on the underside of the composite board;

reinforcing the metal contacts to form freely accessible surface-mountable external contact areas;

testing the functionality of the semiconductor devices on the adhesive film via contacting the external contact areas; and singulating the semiconductor devices while removing functional semiconductor devices from the adhesive film.

2. The method of claim 1, further comprising:

applying a device inscription to the top sides of the semiconductor device positions via laser ablation.

3. The method of claim 2, wherein the laser energy that applies the inscription is reduced in comparison with the laser energy for introducing the separating trenches.

4. The method of claim 1, wherein the wiring structure with metal contacts is formed on the underside of the composite board by selective electrodeposition of metal structures on the metallic carrier, the metallic carrier comprising copper.

5. The method of claim 1, further comprising:

applying a semiconductor chip to the wiring structure in the semiconductor device positions and electrically connecting the chip to the wiring structure via connecting elements prior to embedding the components into the plastic housing composition.

6. The method of claim 5, wherein the semiconductor chip is applied to the wiring structure via an adhesive bonding technique.

7. The method of claim 5, wherein the semiconductor chip is applied to the wiring structure via a soldering technique.

8. The method of claim 5, wherein contact areas of the semiconductor chip are electrically connected to the wiring structure via bonding wires.

9. The method of claim 5, wherein contact areas of the semiconductor chip are electrically connected to the wiring structure via flip-chip contacts.

10. The method of claim 1, wherein the components are embedded into the plastic housing composition via a dispensing process.

11. The method of claim 1, wherein the components are embedded into the plastic housing composition via an injection-molding process.

12. The method of claim 1, wherein removal of the plastic housing composition during the introduction and formation of the separating trenches is limited by reflection properties of the metallic carrier.

13. The method of claim 1, wherein the adhesive film is provided with a perforation prior to being adhesively bonded to top sides of the semiconductor device positions.

14. The method of claim 1, wherein the metallic carrier is removed via a wet etching process.

15. The method of claim 1, wherein the metallic carrier is removed via a plasma etching process.

16. The method of claim 1, wherein the metallic carrier is removed via laser ablation.

17. The method of claim 1, wherein the metal contacts are reinforced by a solder technique to form surface-mountable external contact areas.

18. The method of claim 1, wherein the metal contacts are reinforced via electrochemical deposition to form surface-mountable external contact areas.

19. The method of claim 1, wherein the metal contacts are reinforced to form surface-mountable external contact areas via electroless deposition.

20. The method of claim 1, further comprising:

soldering solder balls on to the external contact areas of functional semiconductor devices prior to removing the adhesive film.

\* \* \* \* \*